(12) United States Patent
Choi

(10) Patent No.: US 8,796,158 B2
(45) Date of Patent: Aug. 5, 2014

(54) METHODS FOR FORMING CIRCUIT PATTERN FORMING REGION IN AN INSULATING SUBSTRATE

(75) Inventor: Kyoung-sei Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 118 days.

(21) Appl. No.: 13/346,041

(22) Filed: Jan. 9, 2012

(65) Prior Publication Data

US 2012/0102734 A1    May 3, 2012

Related U.S. Application Data

(62) Division of application No. 10/864,870, filed on Jun. 10, 2004, now Pat. No. 8,110,918.

(30) Foreign Application Priority Data

Jun. 12, 2003 (KR) ........................ 10-2003-0037859

(51) Int. Cl.
*H01L 21/469*    (2006.01)
*H01L 23/053*    (2006.01)
*H01L 21/48*    (2006.01)
*H01L 21/312*    (2006.01)
*H01L 23/31*    (2006.01)

(52) U.S. Cl.
CPC ........ *H01L 21/4846* (2013.01); *H01L 21/3122* (2013.01); *H01L 23/3107* (2013.01)
USPC ........... 438/780; 438/781; 438/584; 438/125; 438/107; 257/700; 257/701; 257/702

(58) Field of Classification Search
CPC . H01L 21/4846; H01L 21/3122; H01L 23/21; H01L 2224/16; H01L 21/4587; H01L 21/568; H01L 23/49822; H01L 2924/01078; H05K 2203/1536
USPC ......... 438/125, 107, 108, 678, 677, 780, 781; 257/700, 702, 701
See application file for complete search history.

(56) References Cited

U.S. PATENT DOCUMENTS 4,180,608 A * 12/1979 Del ............................... 428/196
4,697,204 A     9/1987 Mita et al.
(Continued)

FOREIGN PATENT DOCUMENTS

GB    2 336 469 A    10/1999
JP    61-160995 A    7/1986
(Continued)

OTHER PUBLICATIONS

European Search Report from the European Patent Office dated Apr. 8, 2010, for corresponding European Patent Application No. 04253544.3.

(Continued)

*Primary Examiner* — Thinh T Nguyen
(74) *Attorney, Agent, or Firm* — Harness, Dickey & Pierce, PLC

(57) ABSTRACT

A method for forming a circuit pattern forming region in an insulating substrate may include preparing a metallic pattern, coating a polymer solution on a casting vessel, precuring the polymer solution, and forming an imprinted circuit pattern forming region in the precured polymer solution using the metallic pattern.

20 Claims, 13 Drawing Sheets

(56) References Cited

U.S. PATENT DOCUMENTS

| | | | |
|---|---|---|---|
| 5,010,389 A | 4/1991 | Gansauge et al. | |
| 6,154,366 A | 11/2000 | Ma et al. | |
| 6,368,981 B1 | 4/2002 | Sugai | |
| 7,080,448 B2 * | 7/2006 | Wu et al. | 29/852 |
| 2003/0156402 A1 * | 8/2003 | Ding et al. | 361/820 |
| 2004/0097072 A1 * | 5/2004 | Carter et al. | 438/678 |

FOREIGN PATENT DOCUMENTS

| | | |
|---|---|---|
| JP | 62-35693 | 2/1987 |
| JP | 02-083227 A | 3/1990 |
| JP | 02-117194 | 5/1990 |
| JP | 03-201588 A | 9/1991 |
| JP | 03-239531 A | 10/1991 |
| JP | 05-218608 A | 8/1993 |
| JP | 08-295538 A | 11/1996 |
| JP | 09-018118 A | 1/1997 |
| JP | 11-126951 A | 5/1999 |
| JP | 11-186698 A | 7/1999 |
| JP | 2000-019343 A | 1/2000 |
| JP | 2002-080246 A | 3/2002 |
| JP | 2002-110747 A | 4/2002 |
| JP | 2002-334910 A | 11/2002 |
| JP | 2003-021741 A | 1/2003 |
| JP | 2003-121997 A | 4/2003 |
| KR | P1989-0007620 | 6/1989 |
| KR | 10-1987-0011850 | 10/1997 |
| KR | 10-2001-0093616 | 10/2001 |
| KR | 10-2001-0095280 | 11/2001 |
| KR | 10-2001-0112761 | 12/2001 |

OTHER PUBLICATIONS

European Search Report from the European Patent Office dated Aug. 2, 2010.
Japanese Office Action dated Jul. 13, 2010.
Office Action from the Chinese Patent Office dated May 11, 2007, for corresponding Chinese Patent Application No. 200410068472.7.
Korean Office Action dated Apr. 25, 2005 (with translation).
Chou, Stephen Y. et al., "Imprint of sub-25 nm vias and trenches in polymers," Applied Physics Letter, vol. 67 (21) Nov. 20, 1995, pp. 3114-3116.
Korean Office Action dated Jan. 11, 2006 (with translation).
Official Inquiry dated Mar. 27, 2012, issued by the Japan Patent Office for related Japanese patent application No. 2011-025620.
Japanese Office Action for 2011-025620, dated Aug. 28, 2012.

* cited by examiner

US 8,796,158 B2

METHODS FOR FORMING CIRCUIT PATTERN FORMING REGION IN AN INSULATING SUBSTRATE

CROSS-REFERENCE TO RELATED APPLICATIONS

This application is a divisional application of U.S. patent application Ser. No. 10/864,870, filed on Jun. 10, 2004 now U.S. Pat. No. 8,110,918, and claims the associated benefit under 35 U.S.C. §121. The entire contents of parent U.S. patent application Ser. No. 10/864,870, entitled "FLEXIBLE SUBSTRATE FOR A SEMICONDUCTOR PACKAGE, METHOD OF MANUFACTURING THE SAME, AND SEMICONDUCTOR PACKAGE INCLUDING FLEXIBLE SUBSTRATE", are incorporated herein by reference. Additionally, this application claims priority to Korean Patent Application No. 10-2003-0037859, filed on Jun. 12, 2003, in the Korean Intellectual Property Office (KIPO), the entire disclosure of which is incorporated herein by reference.

FIELD

The present invention relates to a flexible substrate and method for manufacturing the same, and more particularly, to a flexible substrate, method of manufacturing, and a semiconductor used in a liquid crystal display (LCD) driving integrated circuit (LDI) semiconductor package.

DESCRIPTION OF CONVENTIONAL ART

As semiconductor devices become thinner, smaller, more highly integrated, and/or faster with an increasing number of pins, the use of a flexible substrate with an insulating substrate formed of a flexible material may become more important when mounting semiconductor chips.

In a conventional flexible substrate, a flexible pattern and a lead, which may be connected to the flexible pattern, may be formed on a thin film, which may be formed of an insulating material such as a polyimide resin. A bump, which may have been manufactured on a semiconductor chip, may be bonded to the flexible pattern of the flexible substrate using tape automated bonding (TAB) technology. A conventional semiconductor package may be used as an LCD driving integrated circuit (LDI) device and may be referred to as a tape carrier package (TCP) or a chip-on-film (COF) package.

FIG. 1 is a flowchart illustrating a conventional method of manufacturing a flexible substrate that may be used in an LDI semiconductor package. FIGS. 2 through 11 illustrate the conventional method of FIG. 1 in more detail.

Referring to FIGS. 1 and 2, S50 illustrates a polymer solution 12 which may be coated on a casting plate 10 and dried, a solvent of the polymer solution 12 which may be evaporated, and the polymer solution 12 which may be thermally treated and cured. Referring to FIG. 3, S52 illustrates post-curing, which may be repeatedly performed on the insulating substrate, and cross-linking, which may be performed on the insulating substrate 12, which may increase the density of the insulating substrate 12. The insulating substrate 12 may be isolated.

Referring to FIG. 4, S54 illustrates a seed layer 14, which may be created using nickel, chrome alloy, or copper and a copper pattern may be formed on an upper surface of the insulating substrate 12 (FIG. 4 and S54 of FIG. 1). The seed layer 14 may be formed to reinforce adhesion between a copper plate layer (16 of FIG. 5), which may be formed in a process on the insulating substrate 12. The seed layer 14 may be formed by sputtering.

Referring to FIG. 5, electrolytic plating may be performed on the insulating substrate 12 on which the seed layer 14 may be formed, thereby forming the copper plate layer 16 on the seed layer 14 at S56. Referring to FIG. 6, a photoresist 18 may be coated on the copper plate layer 16 for an etching process.

The thickness of the flexible pattern may be decreased by soft etching the copper plate layer 16 or by removing an antioxidant film which may be formed on the surface of the copper plate layer 16 before coating the photoresist 18.

Referring to FIGS. 7 and 8, after an exposure process may be performed on the photoresist 18 using a photomask (not shown), a photoresist pattern 20 may be formed by a development process. Referring to FIG. 9, the seed layer 14 and the copper plate layer 16 may be etched using the photoresist pattern 20 as an etching mask in S58, thereby forming a circuit pattern 22. The circuit pattern 22 may be formed by wet etching, and the photoresist pattern 20 may be removed after the wet etching may be performed.

Referring to FIG. 10, a solder resist 24 may be coated on a part of the structure in S60. Referring to FIG. 11, a plating portion 26 may be formed on another part of the circuit pattern 22 on which the solder resist 24 may not be formed in S62.

The conventional method of manufacturing the flexible substrate, which may be used in the semiconductor package, may be characterized by the circuit pattern 22 protruding from the upper surface of the insulating substrate 12. The conventional method may include an insulating substrate manufacturing process (FIGS. 2 and 3), a flexible copper clad laminate (FCCL) process (FIGS. 4 and 5), and a circuit pattern processing process (FIGS. 6 through 11). Accordingly, a higher yield may not be obtained and/or the semiconductor manufacturing process may be inefficient.

SUMMARY

Exemplary embodiments of the present invention provide a flexible substrate semiconductor package and method for manufacturing the same in which a circuit pattern may be formed in an imprinting process, simplifying a semiconductor manufacturing process, increasing productivity and yield, and reducing manufacturing costs.

An exemplary embodiment of the present invention may provide a flexible substrate for a semiconductor package, which may comprise an insulating substrate which may have a circuit pattern forming region having a dented shape, which may be formed of a plurality of indentations; a circuit pattern, which may be formed of a metallic material and may be disposed in the circuit pattern forming region of the insulating substrate; a plating portion, which may cover a portion of the surface of the circuit pattern; and a solder resist, which may cover a portion of the surface of the circuit pattern.

In an exemplary embodiment of the present invention, the circuit pattern forming region may be formed of a metallic pattern, and the metallic pattern may be formed of a metallic material or transparent quartz.

In an exemplary embodiment of the present invention, the insulating substrate may be formed of a thermosetting resin or a photo-crosslinkable resin and may be formed of one or more materials selected from an insulating material group which may include polyimide and polybenzoxazole, which may have higher heat-resistance and durability.

In an exemplary embodiment of the present invention, the circuit pattern may be formed of one or more materials selected from the group which may include nickel (Ni), chromium (Cr), copper (Cu), and any alloy thereof. The plating portion may be formed of one or more materials selected from the group which may include gold (Au), Ni, and tin (Sn), and the insulating substrate may be a wiring substrate for a chip-on-film (COF) package.

Another exemplary embodiment of the present invention may provide for a method of manufacturing a flexible substrate for a semiconductor package. A circuit pattern forming region having a dented shape, which may be comprised of a plurality of indentations, may be formed in the insulating substrate. A circuit pattern may be formed in the circuit pattern forming region, and a plating portion and a solder resist may be formed on the circuit pattern, wherein the circuit pattern may be formed of a metallic material.

In an exemplary embodiment of the method of manufacturing, a polymer solution may be coated on a casting vessel, and the polymer solution may be pre-cured. A polymer film, which may be for an insulating substrate may be formed, and an imprinted circuit pattern forming region, which may use a metallic pattern, may be formed in the polymer film. The polymer film, in which the imprinted circuit pattern forming region may be formed, may be cured, which may increase the density of the polymer film. A sprocket hole may be formed in the polymer film, and the polymer film in which the sprocket hole may be formed, may be wound in a reel.

In an exemplary embodiment of the method of manufacturing, a polymer solution may be coated a first time on a casting vessel, and the polymer solution may be dried and pre-cured. The polymer solution may be coated a second time on the casting vessel, and the polymer solution may be dried. The imprinted circuit pattern region may be formed in the polymer solution using the metallic pattern, the polymer solution may be cured, and a polymer film may be formed, which may increase the density of the polymer film. A sprocket hole may be formed in the polymer film, and the polymer film, in which the sprocket hole may be formed, may be wound in a reel.

In an exemplary embodiment of the present invention, the forming of the circuit pattern region may comprise pressing the metallic pattern into the polymer film, and baking the polymer film at 200° C. to 360° C., which may increase a rate of cross-linking in the polymer film.

In an exemplary embodiment of the present invention, the forming of the circuit pattern region may be performed using different methods such as sputtering, chemical vapor deposition (CVD), electrolytic plating, wet etching, dry etching, chemical mechanical polishing (CMP), or buffing.

In another exemplary embodiment of the present invention, the forming of the circuit pattern region may be performed by inserting a paste, which may be formed of a conductive material, into the circuit pattern forming region using a squeeze plate.

Exemplary embodiments of the method of manufacturing a flexible substrate for a semiconductor package according to the present invention may not involve a photolithography process using a photoresist, which may reduce manufacturing costs and/or improve productivity. Further defects that may occur when forming a circuit pattern using a metallic material may be reduced, reliability of the flexible substrate may be improved, and/or a circuit pattern having a finer line width may be formed with improved yield.

BRIEF DESCRIPTION OF THE DRAWINGS

Various features of the present invention will become readily apparent from the description of the exemplary embodiments that follow with reference to the attached drawings, in which.

DETAILED DESCRIPTION OF EXAMPLE EMBODIMENTS

Exemplary embodiments of the present invention will now be described more fully with reference to the attached drawings in which exemplary embodiments of the invention are shown.

A flexible substrate for a semiconductor package, for example an LCD driving integrated circuit (LDI), according to the exemplary embodiments of the present invention may be used with the broadest meaning and may not be limited to a flexible substrate for a specific semiconductor package, such as a chip-on-film (COF) package.

In an exemplary embodiment, a flexible substrate may be used in a COF package. However, the flexible substrate may be used in a wafer level package (WLP), ball grid array (BGA) package, or any other package. Further, various changes in a process of forming a circuit pattern forming region on an insulating substrate and in a process of forming a plating portion and a solder resist may be made by those skilled in the art. The contents described in the following embodiments are exemplary and are not limiting.

Figure 1:
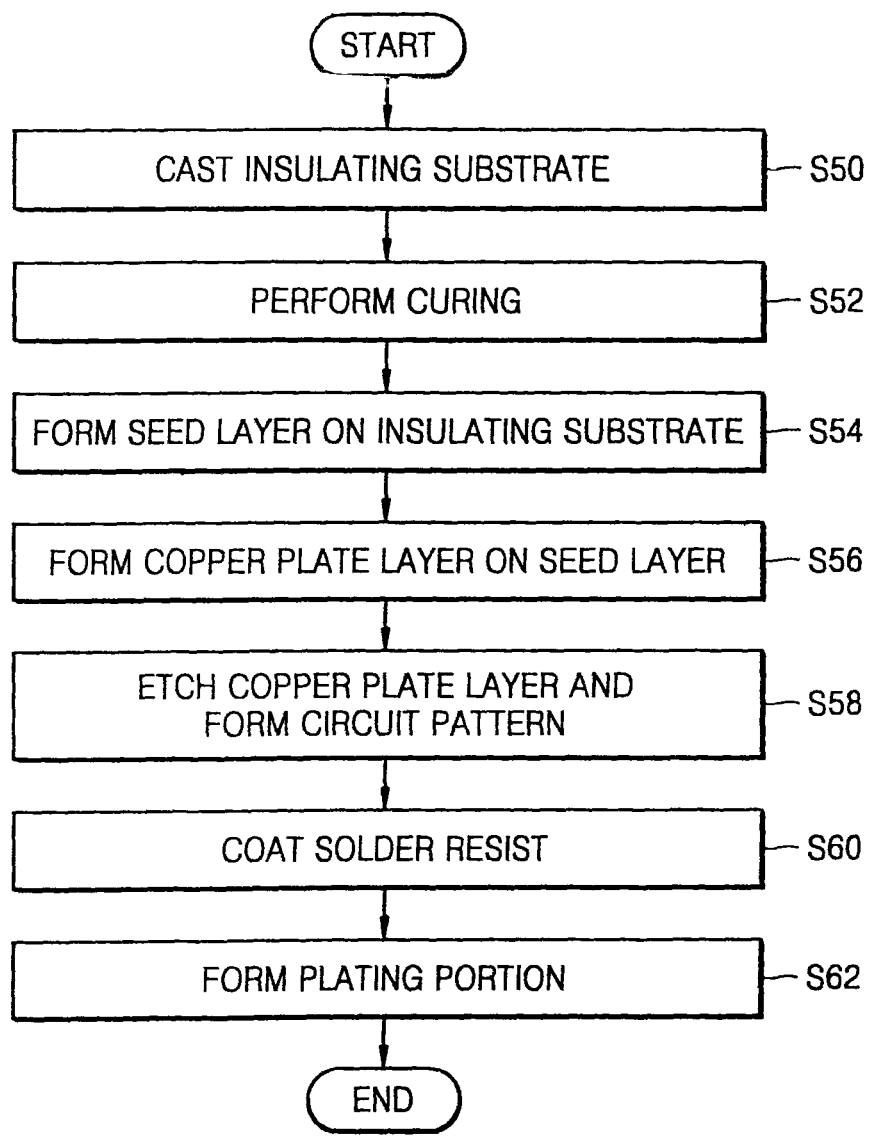
FIG. 1 is a flowchart illustrating a conventional method of manufacturing a flexible substrate which may be used in an LCD driving integrated circuit (LDI) semiconductor package.
Figure 2:
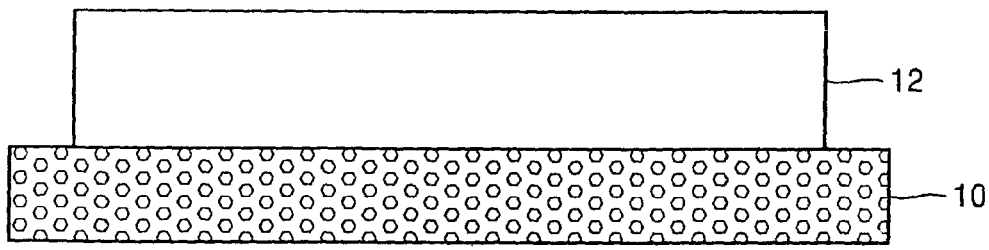
FIGS. 2 through 11 illustrate the conventional method of manufacturing the flexible substrate which may be used in an semiconductor package illustrated by the flowchart of FIG. 1.
Figure 3:
Figure 4:
Figure 5:
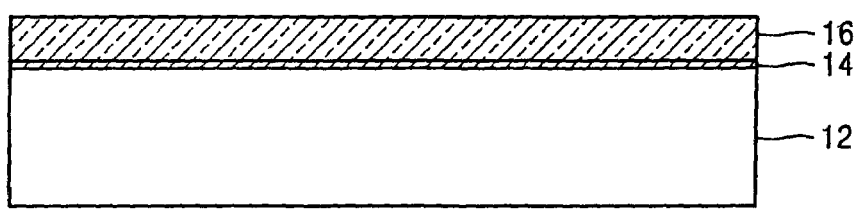
Figure 6:
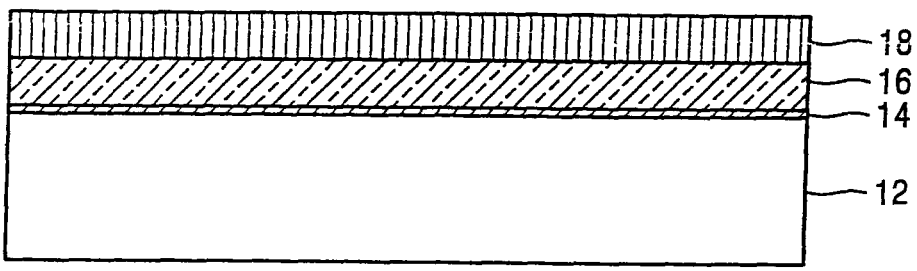
Figure 7:
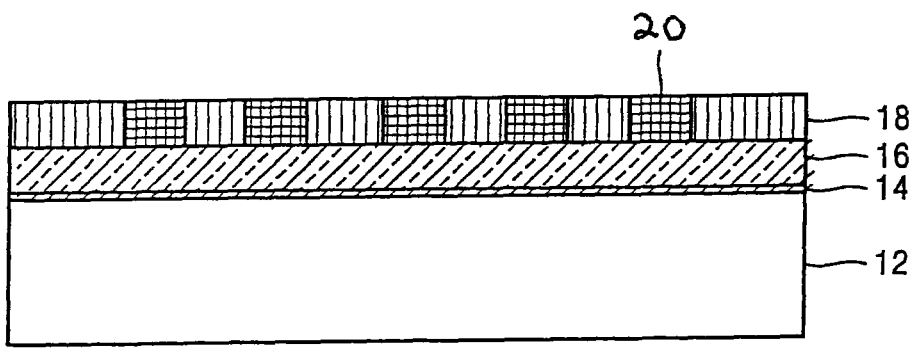
Figure 8:
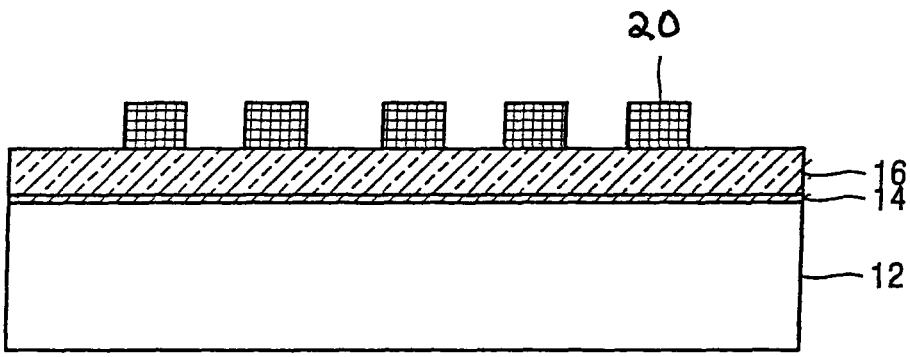
Figure 9:
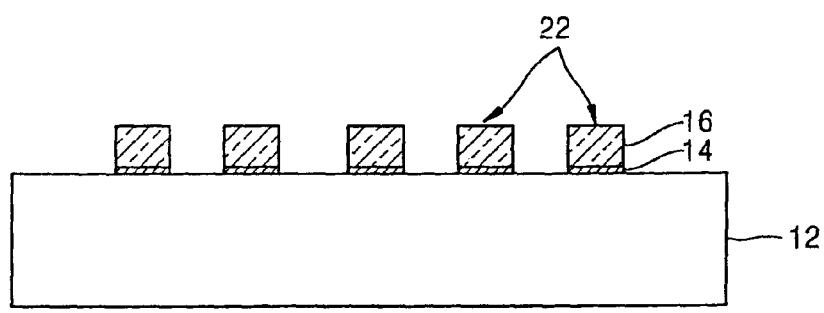
Figure 10:
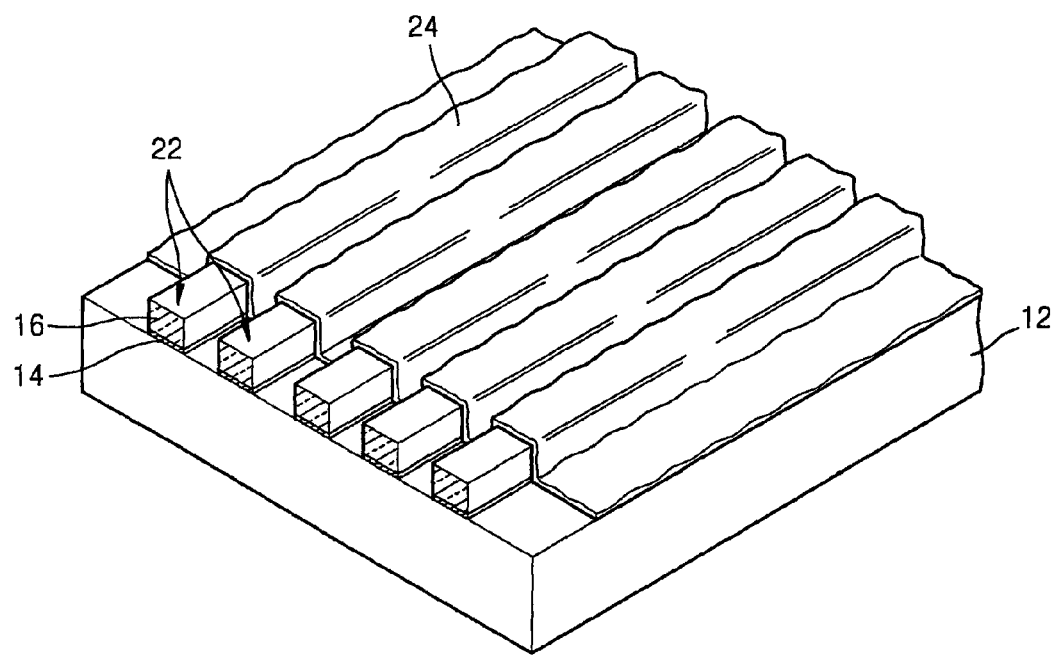
Figure 11:
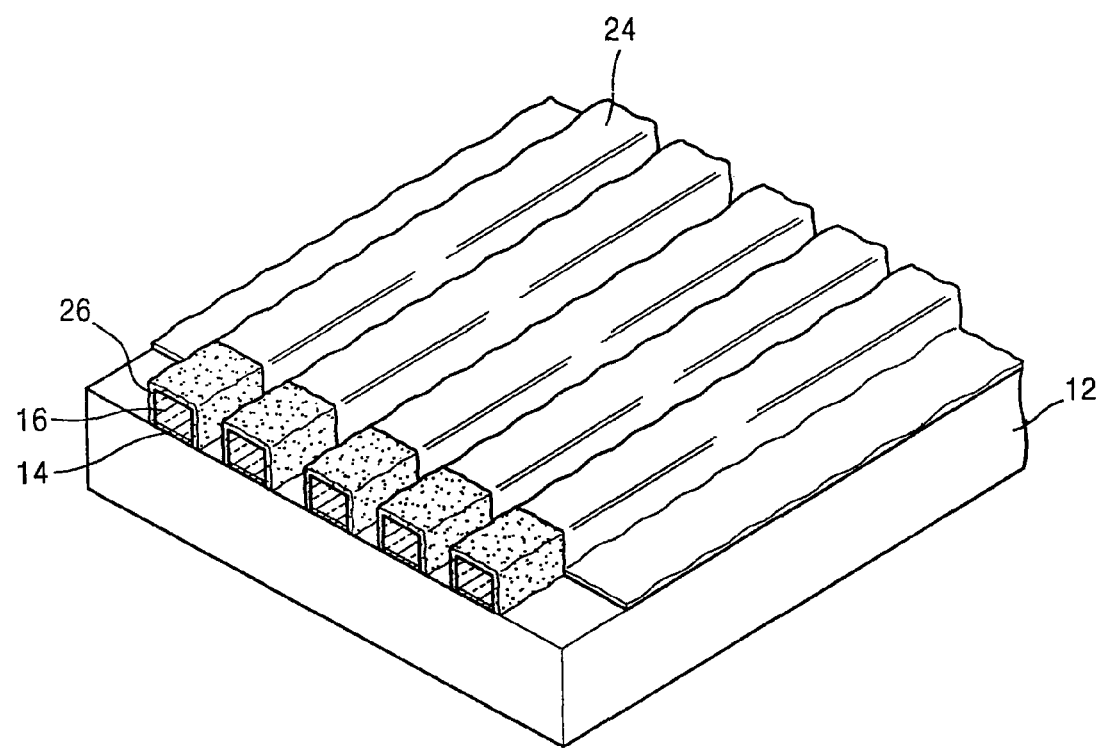
Figure 12:
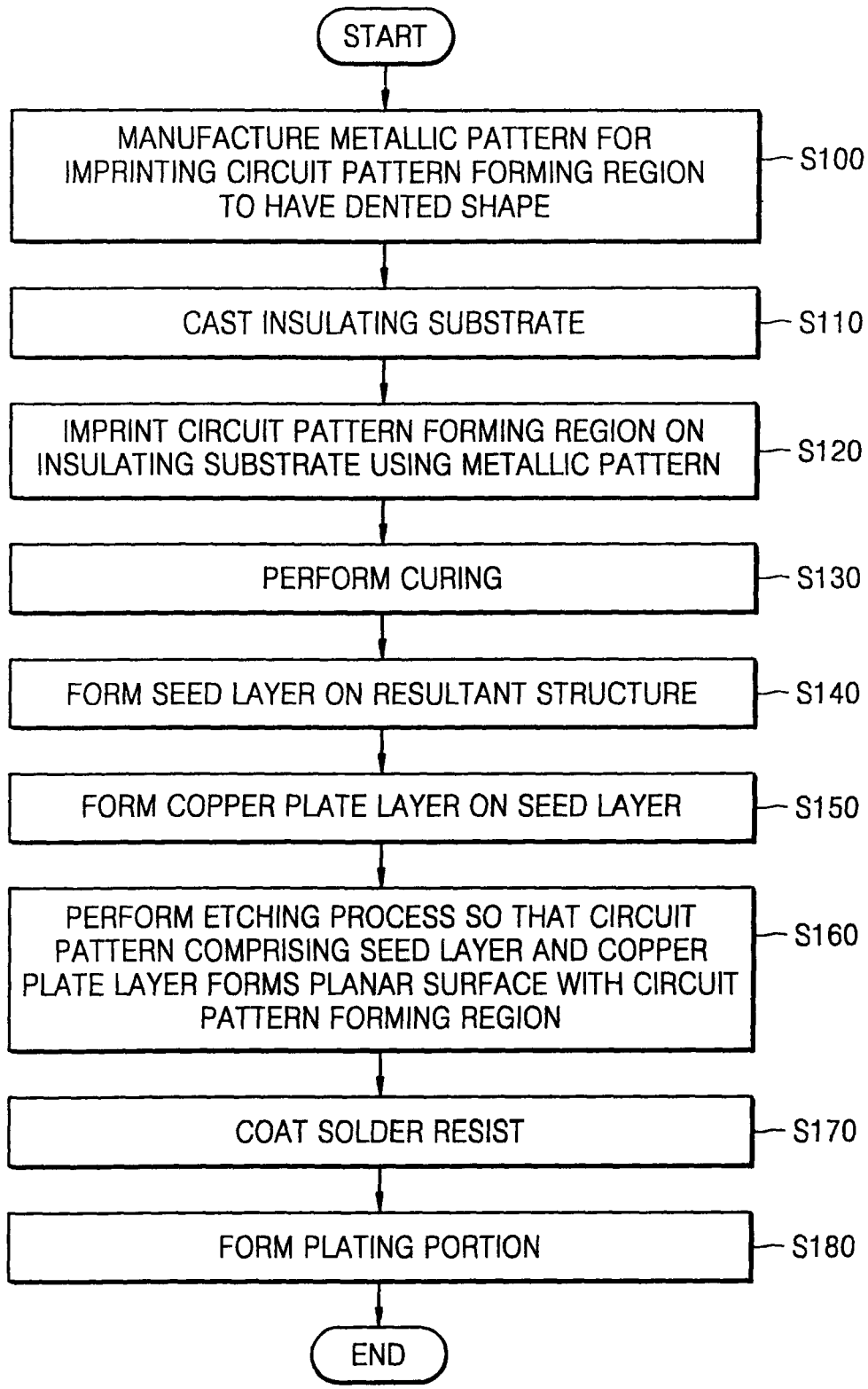
FIG. 12 is a flowchart illustrating a method of manufacturing a flexible substrate which may be used in a semiconductor package according to an exemplary embodiment of the present invention.

FIG. 12 is a flowchart illustrating an exemplary embodiment of a method of manufacturing a flexible substrate which may be used in a semiconductor package. Referring to FIG. 12, in S100 a metallic pattern, which may have a plate or drum shape and may be comprised of a plurality of protruding portions, for imprinting a circuit pattern forming region on an insulating substrate to have a dented shape, and may be comprised of a plurality of indentations which may be complementary to that of the metallic pattern, may be provided. A polymer solution may be coated on a casting vessel and dried such that the insulating substrate may be cast in S110. In S120, the circuit pattern forming region may be imprinted on the insulating substrate using the metallic pattern which may have a dented shape in S120. Curing may be performed in S130, which may increase the density of the insulating substrate.

A seed layer may be formed on the structure in S140, and a copper plate layer may be formed on the seed layer in S150. The structure may be polished by chemical mechanical polishing (CMP) such that a circuit pattern, which may comprise the seed layer and the copper plate layer, may form a planar surface with the circuit pattern forming region in S160.

A solder resist may be formed on a portion of the structure of the insulating substrate on which the circuit pattern may be formed in S170, and a plating portion may be formed in S180. The method of manufacturing a flexible substrate, which may be used in a semiconductor package according to exemplary embodiments of the present invention, may include a circuit pattern, which may have a protruding shape, and may be formed of a metallic material on a circuit pattern forming region using a damascene process.

Figure 13:
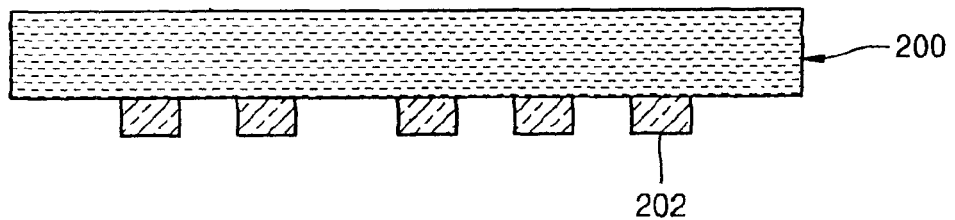
FIGS. 13 through 21 are views and a flowchart illustrating the method of manufacturing the flexible substrate which may be used in a semiconductor package illustrated by the flowchart of FIG. 12.
Figure 14:
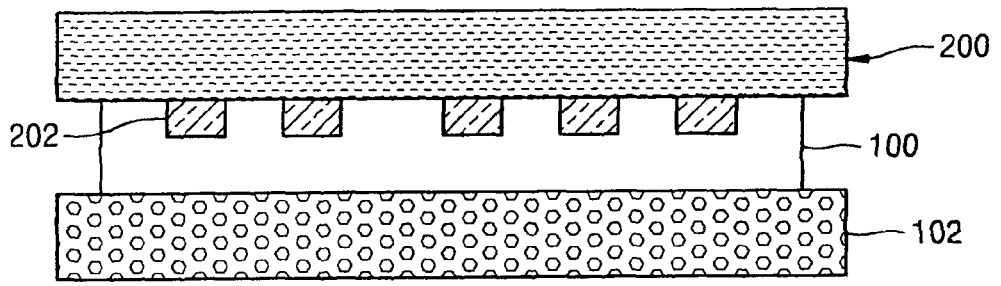
Figure 15:
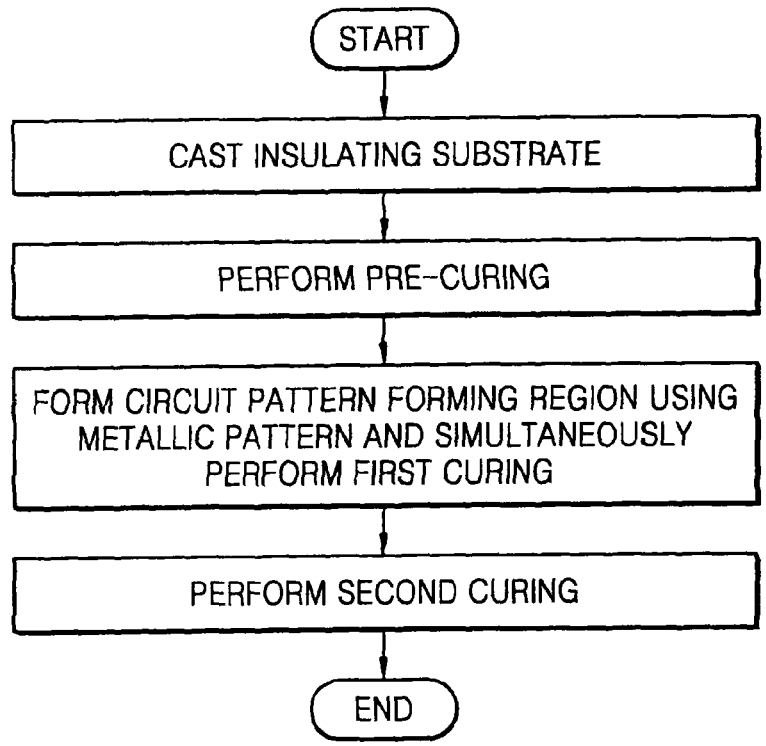

FIGS. 13, 14, and 16 through 21 illustrate an exemplary embodiment of the method of manufacturing the flexible substrate which may be used in a semiconductor package, and FIG. 15 is a flowchart describing the view illustrated by FIG. 14.

Referring to FIG. 13, a metallic pattern 200, which may be for forming a circuit pattern forming region having a dented shape on an insulating substrate, may be manufactured. The metallic pattern 200 may be formed of a metallic material or a transparent quartz material, and may include a protruding portion such as a plurality of concave patterns 202, which may be for forming the circuit pattern forming region. The shape of the protruding portion 202 may be complementary to the shape of the circuit pattern forming region having the dented shape. The width of the protruding portion 202 may be 7-15 μm, and the height of the protruding portion 202 may be 16-32% of the thickness of the insulating substrate, or about 5-15 μm.

The transparent quartz material may be used for the metallic pattern 200 such that light may be transmitted to the metallic pattern 200 when the circuit pattern forming region may be imprinted on the insulating substrate using the metallic pattern 200. Light may be transmitted to the metallic pattern 200 when the insulating substrate may be formed of a photo-crosslinkable material in which a cross-linking speed may increase in response to light, for example, polyimide or polybenzoxazole which may include a photoresist.

Referring to FIGS. 14 and 15, a casting vessel 102 may be a movable or fixed plate having an elaborate plane, and a polymer solution 100 for casting the insulating substrate may be coated on the casting vessel 102. The polymer solution 100 may have a thickness of about 10-100 μm, and the polymer solution 100 may be dried at a temperature less than 150° C. Pre-curing may be performed at a temperature of 180° C.-240° C., which may cause the polymer solution 100 to transition through a gel state while changing from a liquid state to a solid state. The metallic pattern 200 may be pressed on the polymer solution 100 such that a circuit pattern forming region, which may have a dented shape and may be comprised of a plurality of indentations, may be formed.

The polymer solution 100 may be a heat-resistant polymer solution or a durable thermosetting resin, for example, polyimide or polybenzoxazole. The polymer solution may be formed of a photo-crosslinkable material by adding a photoresist to the polymer solution, which may be formed of polyimide or polybenzoxazole. In an exemplary embodiment, the metallic pattern may be formed of a transparent quartz material.

The polymer film 100 may be cured a first time by baking at a temperature of 200° C. to 360° C. or by radiating light on the polymer film 100 when the metallic pattern may be pressed on the polymer film 100. Shrinkage of the polymer film 100 may occur, and the polymer film 100 may be separated from the casting vessel 102.

The polymer film 100 may be cured a second time at a temperature of 200° C.-360° C. in a state where a metallic pattern may be released such that productivity may be increased. Cross-linking may be simultaneously performed on the polymer film 100, which may increase the density of the polymer film 100. The temperature of pre-curing, first curing, and second curing may be changed according to the polymer solution 100.

Figure 16:
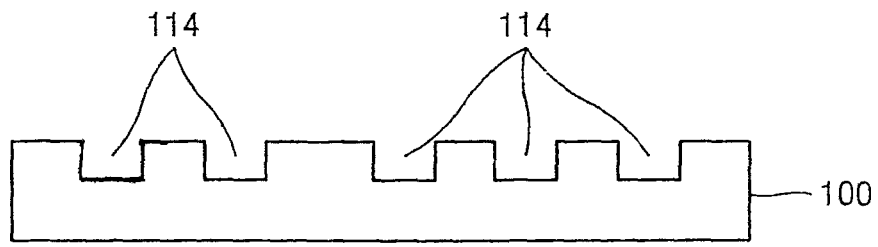

Referring to FIG. 16, a circuit pattern forming region 114 may be formed on a surface of the insulating substrate 100, which may be formed of the polymer film 100, using the metallic pattern 200. The circuit pattern forming region 114 may not require the use of an etching process, and may simplify the method of manufacturing the flexible substrate for a semiconductor package. A sprocket hole may be formed in the insulating substrate 100, wound in a reel, and transferred to another place so as to form a semiconductor package such as COF. The circuit pattern forming region 114, which may have a dented shape, may be formed of a plurality of rows on the insulating substrate 100, and productivity may be increased.

Figure 17:
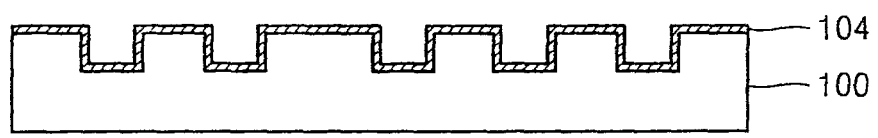

Referring to FIG. 17, a seed layer 104 may be deposited on the polymer film by sputtering, which may improve adhesion between a metal to be used for a circuit pattern and the polymer film 100. The seed layer 104 may be formed of any one of materials selected from a group which may include nickel, zinc, chromium, copper, and any alloy thereof.

Figure 18:
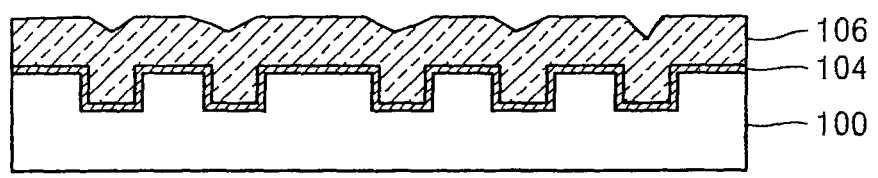

Referring to FIG. 18, electrolytic plating may be performed on a structure in which the seed layer 104 may be formed and a copper plate layer 106 may be formed to a sufficient thickness on the seed layer 104, which may provide a metallic material which may be used to form a circuit pattern on the polymer film 100 in which a circuit pattern forming region may have been formed. In an exemplary embodiment, the metallic material which may be used for the circuit pattern may be formed by electrolytic plating. However, the metallic material may be formed using different methods such as sputtering or chemical vapor deposition (CVD).

Figure 19:
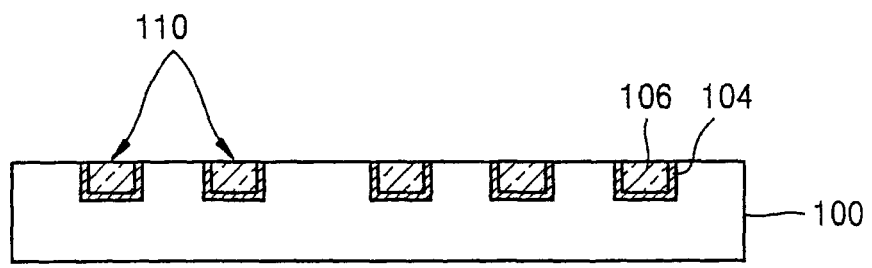

Referring to FIG. 19, an etching process, such as an etchback process, may be performed on the structure such that a circuit pattern 110 fills a circuit pattern forming region having a dented shape. In an exemplary embodiment, the etchback process may be performed by wet etching. The etchback process may be an etching process in which a photoresist may not be used, such as wet etching, dry etching, chemical mechanical polishing (CMP), or buffing.

Figure 20:
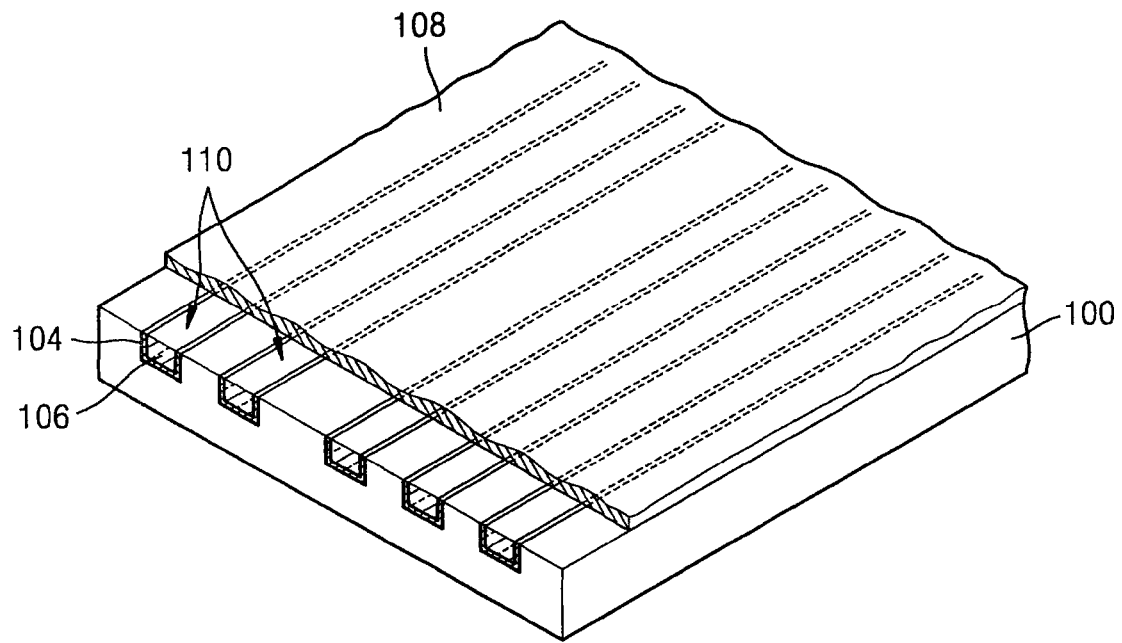

Referring to FIG. 20, a solder resist 108 may be formed on part of the structure. The solder resist 108 may be an insulating material and may be used to protect the circuit pattern 110 from being shorted and from external shock. In an exemplary embodiment, the solder resist 108 may not be coated on the circuit pattern 110 which may be connected to an external circuit.

Figure 21:
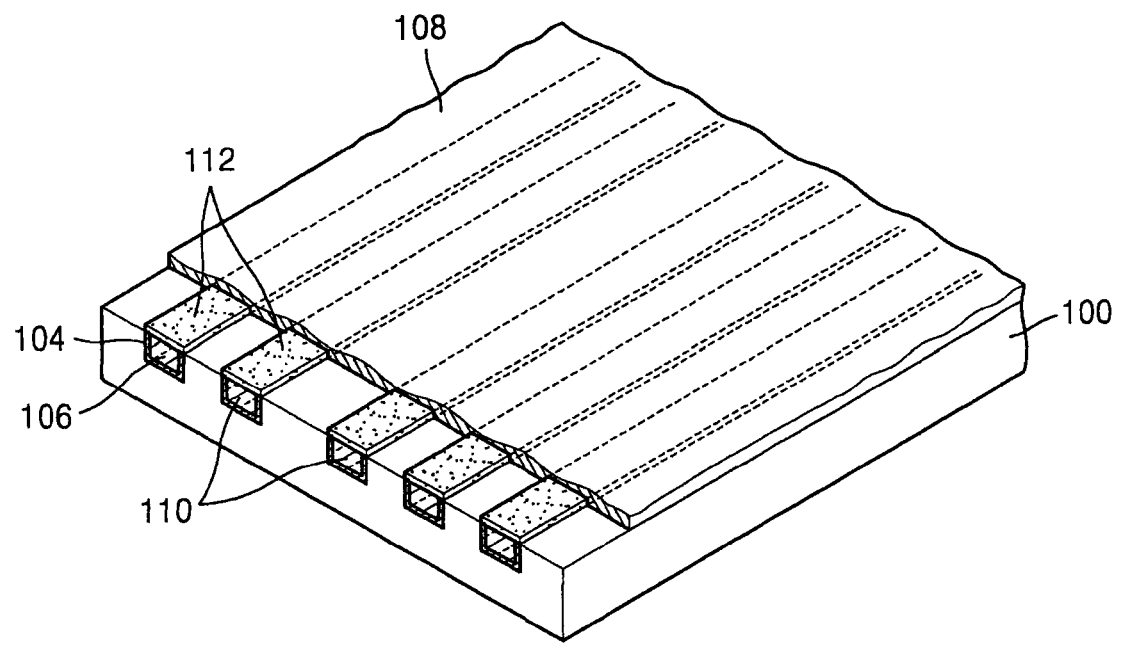

Referring to FIG. 21, a plating portion 112 may be formed on a portion of the circuit pattern 110 on which the solder resist 108 may not be coated. The plating portion 112 may reduce a contact resistance when the circuit pattern 110 may be connected to the external circuit. The plating portion 112 may be formed of a material selected from a group which may include gold, nickel, and tin, which may have high electroconductivity.

Figure 22:
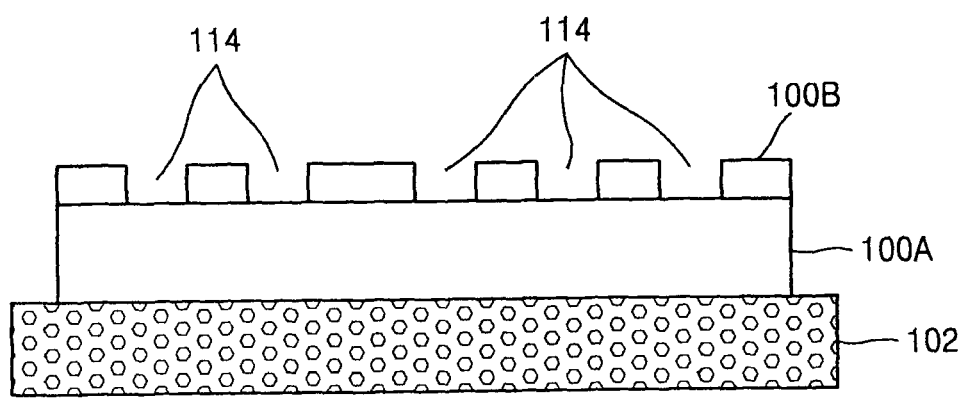
FIG. 22 is a cross-sectional view illustrating another exemplary embodiment of the present invention.
Figure 23:
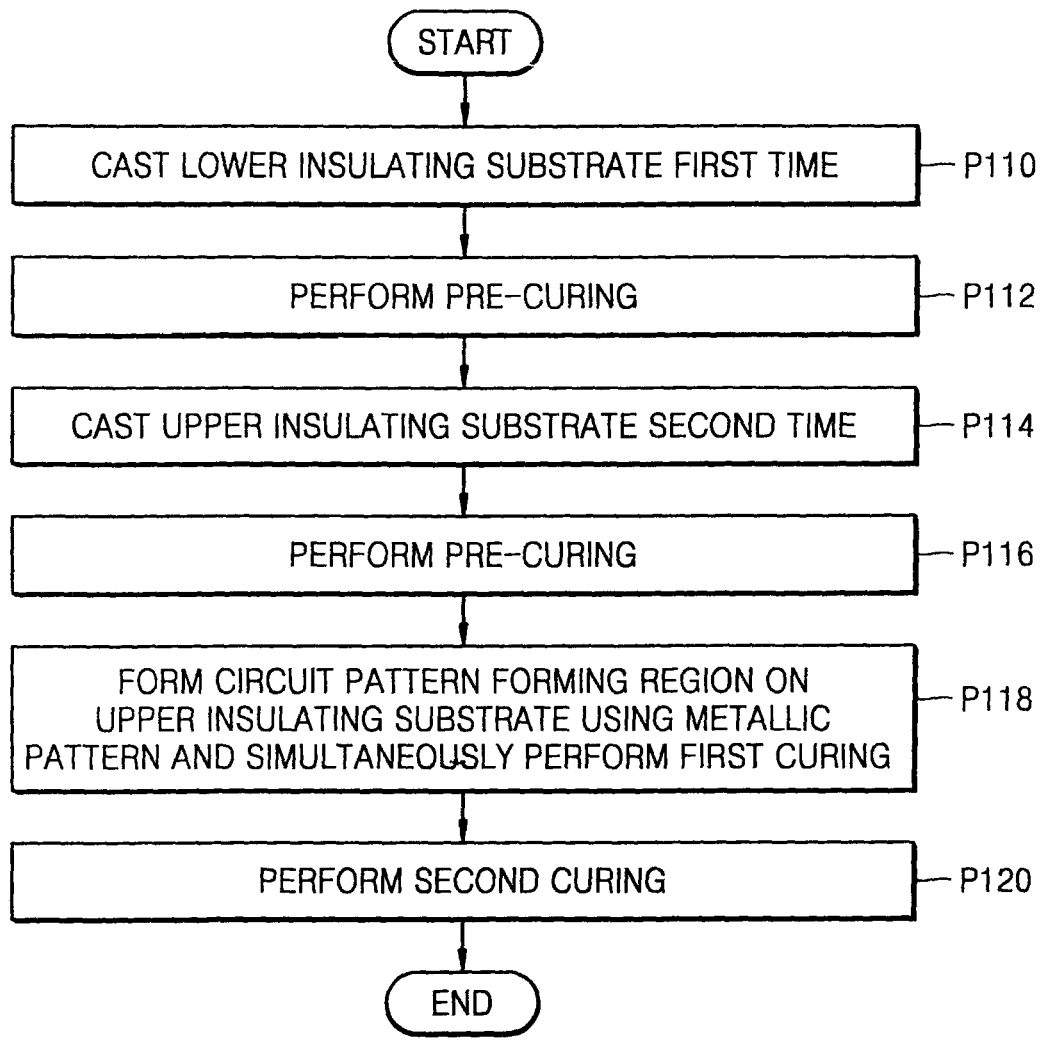
FIG. 23 is a flowchart illustrating a method of manufacturing the exemplary embodiment illustrated in FIG. 22.

FIG. 22 and FIG. 23 illustrate another exemplary embodiment of the present invention which may be formed by modifying the preparation of the polymer solution 100.

Referring to FIGS. 22 and 23, the insulating substrate may be formed by casting twice. A polymer solution 100A may be coated a first time on a casting vessel 102 and casting may be performed on a lower insulating substrate in P110. The thickness of the polymer solution 100A may be determined by subtracting the thickness of a circuit pattern forming region from the thickness of the insulating substrate. When the thickness of the insulating substrate may be 38 μm, the thickness of the polymer solution 100A may be 30 μm.

In step P112, pre-curing may be performed on the polymer solution 100A. In P114, a polymer solution 100B may be coated a second time on the polymer solution 100A and pre-curing may be performed in P116, which may cast an upper insulating substrate. The thickness of the polymer solution 100B may be 16-32% of the thickness of the insulating substrate. When the thickness of the insulating substrate may be 38 μm, the thickness of the polymer solution 100B may be about 8 μm.

A circuit pattern forming region 114, which may be imprinted to have a dented shape, may be formed on the insulating substrate using the metallic pattern illustrated in FIG. 13. A first curing may be performed by applying heat ranging from 200° C. to 360° C. to the polymer solution 100B or by radiating light on the polymer solution 100B in P118. A second curing may be performed in P120 in order to cause cross-linking and form the polymer solution 100, which may increase the density of the polymer solution 100.

Figure 24:
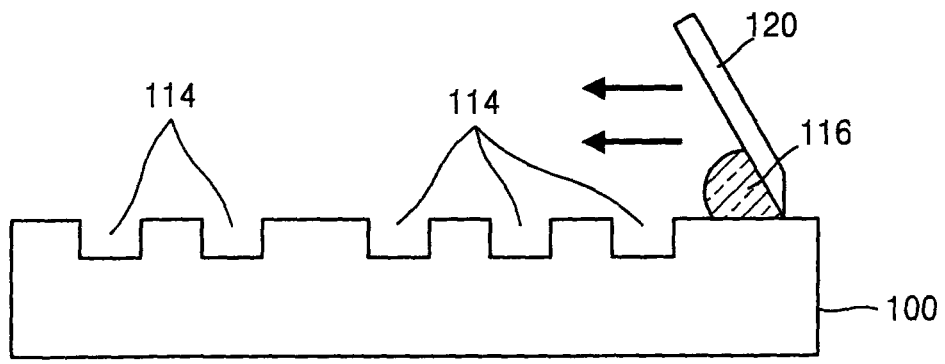
FIG. 24 is a cross-sectional view illustrating another exemplary embodiment of the present invention.

Referring to FIG. 24, in another exemplary embodiment of the present invention, a material, which may be used for a circuit pattern, may be formed using different methods such as sputtering, chemical vapor deposition (CVD), and electrolytic plating. The material may be formed by inserting a paste 116 which may be formed of a conductive material, into the circuit pattern forming region 114 which may use a squeeze plate 120.

Figure 25:
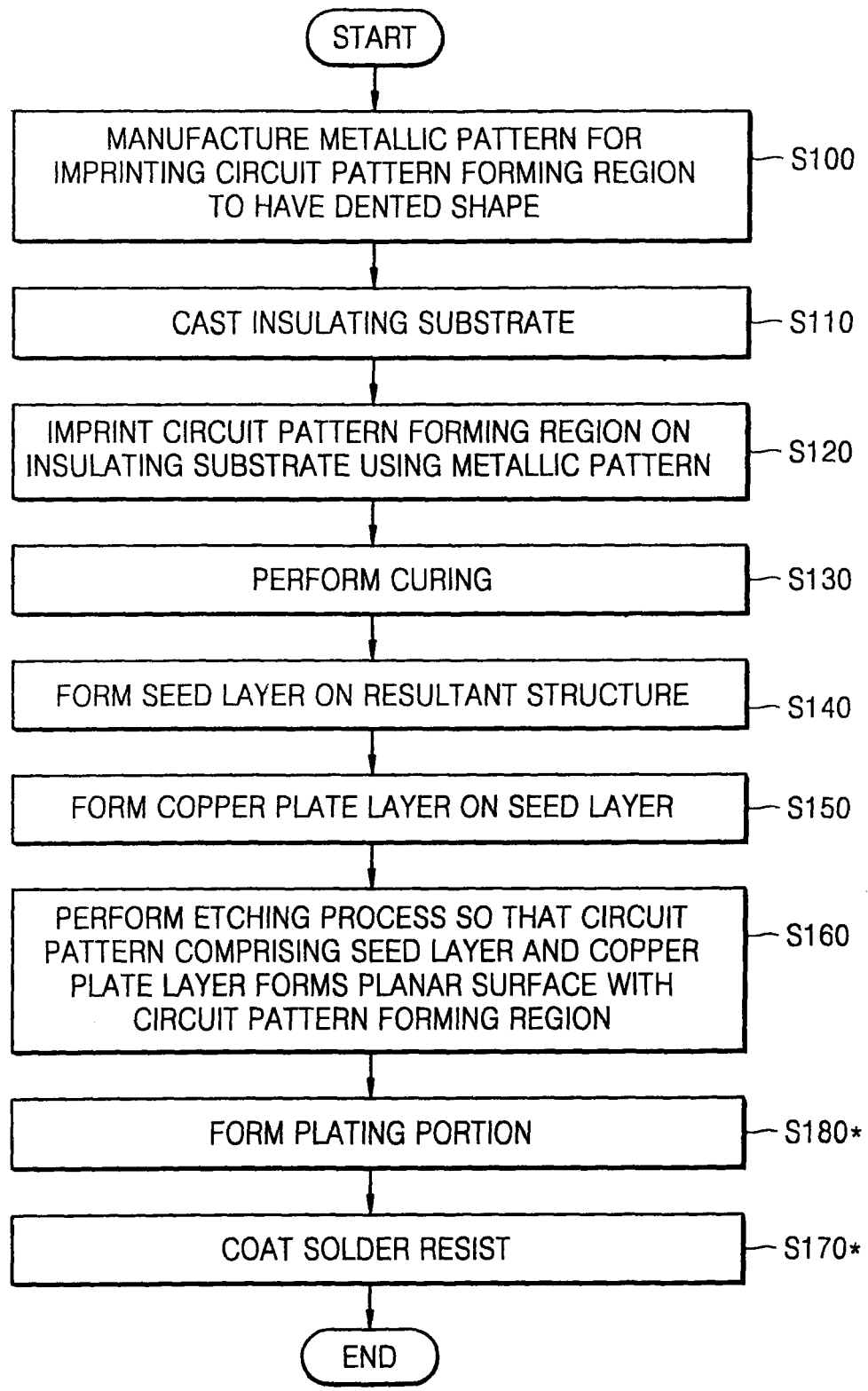
FIG. 25 is a flowchart illustrating a method of manufacturing an exemplary embodiment of the present invention.

Referring to FIG. 25, in another exemplary embodiment of the present invention, the plating portion may be formed before a solder resist. Preparing an insulating substrate and forming a circuit pattern in S100 through S160 may be performed in the same manner as those of the above-described exemplary embodiments. The plating portion may be formed on the circuit pattern in S180, and the solder resist may be coated on part of the circuit pattern that may not be connected to an external circuit in S170.

A double plating process of repeatedly plating the plating portion after coating of the solder resist may be completed in S170.

An exemplary embodiment of a structure of a semiconductor package which may use a flexible substrate according to the present invention will now be described with reference to FIG. 26.

Figure 26:
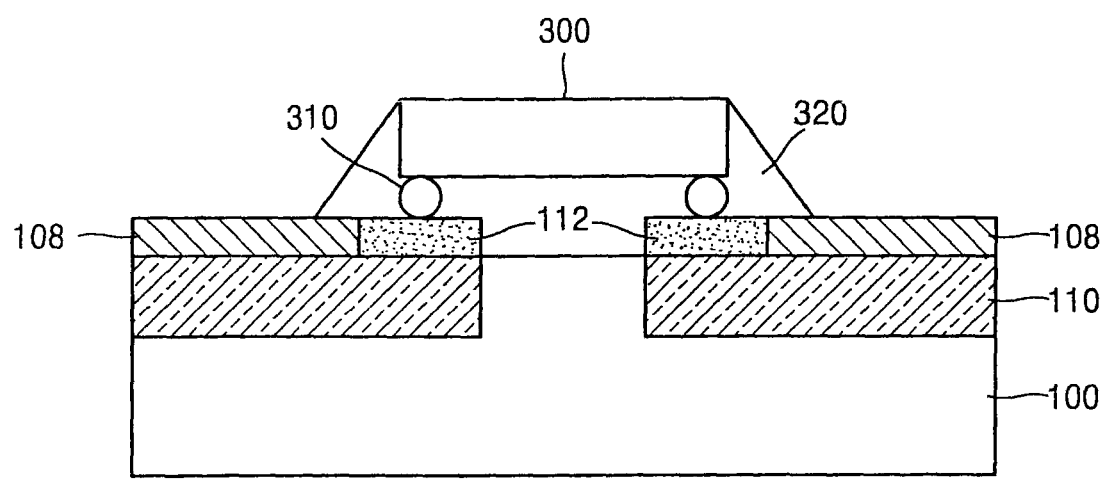
FIG. 26 is a cross-sectional view illustrating a semiconductor package having a chip-on-film (COF) structure which may use a flexible substrate according to another embodiment of the present invention.

Referring to FIG. 26, in another exemplary embodiment of the present invention, the semiconductor package, for example a COF package, may include a circuit pattern 110 in a polymer film 100, a plating portion 112, which may be formed on a portion of an upper surface of the circuit pattern 110, and a solder resist 108 which may be formed on a portion of the upper surface of the circuit pattern 110. A semiconductor chip 300 may be connected to the plating portion 112, which may be formed on the circuit pattern 110, forming a flip-chip structure. An electrode 310 may be connected to a pad (not shown) which may be formed on a top surface of the semiconductor chip 300. The electrode 310 may have a bump or solder ball shape. A space between the semiconductor chip 300 and the polymer film 100 may be filled with a sealing resin 320.

A back side of the semiconductor chip 300 may be exposed, and the lower side of the semiconductor chip 300 may be sealed by the sealing resin 320.

The solder resist 108 may be formed before the plating portion 112 and the solder resist 108 and the plating portion 112 may not overlap. The plating portion 112 may be formed before the solder resist 108 and the solder resist 108 and the plating portion 112 may overlap.

The semiconductor chip 300 may be connected to the plating portion 112 with a flip-chip structure via the electrode 310. Various changes therein may be made, for example, the lower side of the semiconductor chip 300 may be attached to the polymer solution 100 using an adhesive, and the pad of the semiconductor chip 300 and the plating portion 112 may be connected by wire bonding or a lead.

A circuit pattern may be formed without the use of a photolithography process in which a photoresist may be required, and the method may be simpler and/or provide a higher yield. A circuit pattern forming region may be formed such that only one product line may be required to prepare an insulated substrate and process the circuit pattern, which may reduce manufacturing costs. An insulating substrate, which may have a plurality of rows, may be made in mass production using exemplary embodiments of the present invention, thus, productivity may be improved.

The circuit pattern may be buried in the insulating substrate and the circuit pattern may be less likely to break or to have curved surfaces. An abnormally grown defect on the side of a current pattern may be less likely to cause a short between adjacent circuit patterns. A circuit pattern with a fine line width and a fine pitch may be more reliable.

In the flexible substrate and the semiconductor, both surfaces and side surfaces of the circuit pattern may be connected to the insulating substrate, and thus, the circuit pattern may be more strongly adhered to the insulating substrate.

Although a thermosetting or a photo-crosslinkable resin may be used to form the insulating substrate as disclosed in exemplary embodiments of the invention, it will be understood by those skilled in the art that an insulating substrate formed of a crosslinkable resin, a photo-resist, or any combination thereof may be used, as they may suffice to increase the density of the insulating substrate. It will also be understood by those skilled in the art that the shape of the protruding portions 202 and 114 and the dented shape of the insulating substrate may vary in any way as desired.

While this invention has been particularly shown and described with reference to exemplary embodiments thereof, it will be understood by those skilled in the art that various changes in form and details may be made therein without departing from the spirit and scope of the invention as defined by the appended claims and equivalents thereof.

What is claimed is:

1. A method for forming a circuit pattern forming region in an insulating substrate, the method comprising:
   preparing a metallic pattern;
   coating a polymer solution on a casting vessel;
   precuring the polymer solution; and
   forming an imprinted circuit pattern forming region in the precured polymer solution using the metallic pattern;
   wherein the imprinted circuit pattern forming region includes thinner portions of the precured polymer solution than portions of the precured polymer solution not in the imprinted circuit pattern forming region.

2. The method of claim 1, wherein the metallic pattern comprises metallic material.

3. The method of claim 1, wherein the metallic pattern comprises quartz.

4. The method of claim 1, wherein the polymer solution is formed of one or more of a thermosetting resin, photo resist, crosslinkable resin, and a photo-crosslinkable resin.

5. The method of claim 1, wherein the polymer solution is formed of a thermosetting resin.

6. The method of claim 1, wherein the polymer solution is formed of a photo resist.

7. The method of claim 1, wherein the polymer solution is formed of a crosslinkable resin.

8. The method of claim 1, wherein the polymer solution is formed of a photo-crosslinkable resin.

9. The method of claim 1, wherein the polymer solution is formed of one or both of polyimide or polybenzoxazole.

10. The method of claim 1, wherein the polymer solution is formed of one or both of polyimide including a photoresist and polybenzoxazole including a photoresist.

11. The method of claim 1, wherein the circuit pattern forming region includes a plurality of indentations.

12. The method of claim 1, wherein the metallic pattern includes a plurality of protruding portions.

13. The method of claim 1, further comprising:
forming a seed layer on the imprinted circuit pattern forming region and on the areas of the precured polymer solution not in the imprinted circuit pattern forming region.

14. The method of claim 1, further comprising:
forming a seed layer on the precured polymer solution after the forming of the imprinted circuit pattern forming region.

15. The method of claim 14, further comprising:
forming a copper plate layer on the seed layer.

16. The method of claim 15, further comprising:
planarizing a surface of the copper plate layer.

17. The method of claim 16, wherein the planarizing of the surface of the copper plate layer comprises:
removing some of the copper plate layer so that the surface of the copper plate layer is at a same height as a surface of the areas of the precured polymer solution not in the imprinted circuit pattern forming region.

18. The method of claim 16, wherein the planarizing of the surface of the copper plate layer comprises:
removing some of the copper plate layer so that the surface of the copper plate layer is at a same height as a surface of the seed layer.

19. The method of claim 16, wherein the planarizing of the surface of the copper plate layer comprises:
removing some of the copper plate layer so that the surface of the copper plate layer, a surface of the areas of the precured polymer solution not in the imprinted circuit pattern forming region, and a surface of the seed layer have a same height.

20. The method of claim 1, wherein the imprinted circuit pattern forming region includes a dented shape on the precured polymer.

* * * * *